(12) United States Patent
Fan et al.

(10) Patent No.: US 7,315,080 B1
(45) Date of Patent: Jan. 1, 2008

(54) BALL GRID ARRAY PACKAGE THAT INCLUDES A COLLAPSIBLE SPACER FOR SEPARATING DIE ADAPTER FROM A HEAT SPREADER

(75) Inventors: Chun Ho Fan, Sham Tseng (HK); Wing Keung Lam, Kowloon (HK); Ming Wang Sze, Tsuen Wan (HK); Sadak Thamby Labeeb, Tsuen Wan (HK); Neil McLellan, Danville, CA (US); Mohan Kirloskar, Cupertino, CA (US)

(73) Assignee: ASAT Ltd., Tsuen Wan, New Territories (HK)

( * ) Notice: Subject to any disclaimer, the term of this patent is extended or adjusted under 35 U.S.C. 154(b) by 148 days.

(21) Appl. No.: 10/885,965

(22) Filed: Jul. 8, 2004

Related U.S. Application Data

(60) Division of application No. 10/643,961, filed on Aug. 20, 2003, now Pat. No. 6,987,032, which is a continuation-in-part of application No. 10/323,657, filed on Dec. 20, 2002, now Pat. No. 6,979,594, which is a continuation-in-part of application No. 10/197,832, filed on Jul. 19, 2002, now Pat. No. 6,800,948.

(51) Int. Cl.
*H01L 23/34* (2006.01)
(52) U.S. Cl. .................................. 257/717
(58) Field of Classification Search ............ 257/717
See application file for complete search history.

(56) References Cited

U.S. PATENT DOCUMENTS

| | | | |
|---|---|---|---|
| 5,172,213 A | 12/1992 | Zimmerman | |
| 5,311,060 A | 5/1994 | Rostoker et al. | |
| 5,339,216 A | 8/1994 | Lin et al. | |
| 5,444,025 A | 8/1995 | Sono et al. | |
| 5,493,153 A | 2/1996 | Arikawa et al. | |
| 5,610,442 A | 3/1997 | Schneider et al. | |

(Continued)

FOREIGN PATENT DOCUMENTS

DE 100 15 962 10/2001

OTHER PUBLICATIONS

U.S. Appl. No. 10/647,696. Mohan Kirloskar et al., "Improved Ball Grid Array Package and Process for Manufacturing Same", filed Aug. 25, 2003.

(Continued)

*Primary Examiner*—Stephen W. Smoot
(74) *Attorney, Agent, or Firm*—Morrison & Foerster LLP

(57) ABSTRACT

A ball grid array package is manufactured by mounting a semiconductor die to a first surface of a substrate and mounting a die adapter to the semiconductor die. The semiconductor die is wire bonded to ones of conductive traces of the substrate. A collapsible spacer is mounted to the substrate and the substrate is releasably clamped to an upper side of a mold cavity. A heat spreader and at least one collapsible spacer are placed in the mold cavity such that the collapsible spacer is disposed between the heat spreader and the substrate. A molding compound is molded in the mold, thereby molding the semiconductor die, the substrate, the wire bonds, the die adapter, the at least one collapsible spacer and the heat spreader into the molding compound to provide a molded package. A ball grid array is formed on a second surface of the substrate, bumps of the ball grid array being electrically connected to the conductive traces and the integrated circuit package is singulated.

5 Claims, 12 Drawing Sheets

U.S. PATENT DOCUMENTS

| | | | |
|---|---|---|---|
| 5,639,694 A | 6/1997 | Diffenderfer et al. | |
| 5,650,663 A | 7/1997 | Parthasarathi | |
| 5,679,978 A | 10/1997 | Kawahara et al. | |
| 5,705,851 A | 1/1998 | Mostafazadeh et al. | |
| 5,736,785 A | 4/1998 | Chiang et al. | |
| 5,773,362 A | 6/1998 | Tonti et al. | |
| 5,877,552 A | 3/1999 | Chiang | |
| 5,903,050 A * | 5/1999 | Thurairajaratnam et al. | 257/695 |
| 5,977,626 A | 11/1999 | Wang et al. | |
| 5,986,885 A | 11/1999 | Wyland | |
| 6,037,658 A | 3/2000 | Brodsky et al. | |
| 6,236,568 B1 | 5/2001 | Lai et al. | |
| 6,251,706 B1 | 6/2001 | Paniccia | |
| 6,323,066 B2 | 11/2001 | Lai et al. | |
| 6,414,385 B1 | 7/2002 | Huang et al. | |
| 6,462,405 B1 | 10/2002 | Lai et al. | |
| 6,525,421 B1 | 2/2003 | Chia et al. | |
| 6,631,078 B2 | 10/2003 | Alcoe et al. | |
| 6,656,770 B2 | 12/2003 | Atwood et al. | |
| 6,734,552 B2 * | 5/2004 | Combs et al. | 257/707 |
| 6,849,940 B1 * | 2/2005 | Chan et al. | 257/706 |
| 2001/0015492 A1 | 8/2001 | Akram et al. | |
| 2002/0005578 A1 | 1/2002 | Kodama et al. | |
| 2002/0006718 A1 | 1/2002 | Distefano | |
| 2002/0180035 A1 | 12/2002 | Huang et al. | |
| 2002/0185734 A1 | 12/2002 | Zhao et al. | |
| 2003/0034569 A1 | 2/2003 | Caletka et al. | |
| 2003/0075812 A1 | 4/2003 | Cheng et al. | |
| 2003/0160309 A1 | 8/2003 | Punzalan et al. | |

OTHER PUBLICATIONS

U.S. Appl. No. 10/323,657, Chun Ho Fan et al., "Process for Manufacturing Ball Grid Array Package", filed Dec. 20, 2002.

U.S. Appl. No. 10/372,421, Joseph Andrew Martin et al., "Improved Ball Grid Array Package", filed Feb. 24, 2003.

U.S. Appl. No. 10/197,832, Joseph Andrew Martin et al., "Improved Ball Grid Array Package", filed Jul. 19, 2002.

* cited by examiner

BALL GRID ARRAY PACKAGE THAT INCLUDES A COLLAPSIBLE SPACER FOR SEPARATING DIE ADAPTER FROM A HEAT SPREADER

CROSS REFERENCE TO RELATED APPLICATION

This is a Divisional Application of U.S. patent application Ser. No. 10/643,961, filed Aug. 20, 2003, and issued as U.S. Pat. No. 6,987,032, which is a continuation-in-part of U.S. patent application Ser. No. 10/323,657, entitled Process For Manufacturing Ball Grid Array Package, filed Dec. 20, 2002, and issued as U.S. Pat. No. 6,979,594, which is a continuation-in-part of U.S. patent application Ser. No. 10/197,832 entitled Improved Ball Grid Array Package, filed Jul. 19, 2002, and issued as U.S. Pat. No. 6,800,948.

FIELD OF THE INVENTION

The present invention relates in general to integrated circuit packaging, and in particular to an improved ball grid array (BGA) package with enhanced thermal characteristics and a unique method of manufacturing the ball grid array package.

BACKGROUND OF THE INVENTION

High performance integrated circuit (IC) packages are well known in the art. Improvements in IC packages are driven by industry demands for increased thermal and electrical performance and decreased size and cost of manufacture.

In general, array packaging such as Plastic Ball Grid Array (PBGA) packages provide a high density of interconnects relative to the surface area of the package. However, typical PBGA packages include a convoluted signal path, giving rise to high impedance and an inefficient thermal path which results in low thermal dissipation performance. With increasing package density, the spreading of heat generated by the package is increasingly important.

Reference is made to FIG. 1, which shows an elevation view of a conventional PBGA package indicated generally by the numeral 20. The PBGA package 20 includes a substrate 22 and a semiconductor die 24 attached to the substrate 22 by a die adhesive. Gold wire bonds 26 electrically connect the die 24 to metal traces on the substrate 22. The wire bonds 26 and die 24 are encapsulated in a molding compound 28. Solder balls 30 are disposed on the bottom surface of the substrate 22 for signal transfer. Because of the absence of a thermal path away from the semiconductor die 24, thermal dissipation in this package is poor.

Variations to conventional BGA packages have been proposed for the purpose of increasing thermal and electrical performance. One particular variation includes the addition of a metal heat spreader to the package, as shown in FIG. 2 which shows an elevation view of a PBGA package 20 of the prior art including the heat spreader, indicated by the numeral 32. In general, the metal heat spreader is fixed to the molded package. This package suffers disadvantages, however, as heat must be dissipated from the semiconductor die 24, through the molding compound 28 and then through the heat spreader 32.

It is therefore an object of an aspect of the present invention to provide a process for manufacturing a BGA package with a heat spreader that obviates or mitigates at least some of the disadvantages of the prior art.

SUMMARY OF THE INVENTION

In one aspect, a process for manufacturing an integrated circuit package is provided. The process includes mounting a semiconductor die to a first surface of a substrate and mounting a die adapter to said semiconductor die. The semiconductor die is wire bonded to ones of conductive traces of said substrate and at least one collapsible spacer is mounted to at least one of a heat spreader, said die adapter and said substrate. One of the heat spreader and said substrate are placed in a mold cavity and the other of said heat spreader and said substrate is clamped to a die of said mold cavity, such that said collapsible spacer is disposed between said heat spreader and said substrate. A molding compound is molded in the mold, thereby molding the semiconductor die, the substrate, the wire bonds, said die adapter, said at least one collapsible spacer and said heat spreader into the molding compound to provide a molded package. A ball grid array is formed on a second surface of said substrate, bumps of said ball grid array being electrically connected to said conductive traces and the integrated circuit package is singulated.

In another aspect, a process for manufacturing a plurality of integrated circuit packages comprises mounting a plurality of semiconductor dice to a first surface of a substrate array and mounting a plurality of die adapters to said semiconductor dice such that each one of said die adapters is mounted to a corresponding one of said semiconductor dice. The semiconductor dice are wire bonded to ones of conductive traces of said substrate array and a collapsible spacer array is mounted to one of a heat spreader array and said substrate array. One of said heat spreader array and said substrate array is placed in a mold cavity and the other of said heat spreader array and said substrate array is releasably clamped to a first die of said mold such that said collapsible spacer array is disposed between said heat spreader array and said substrate array. A molding compound is molded in the mold, thereby molding the semiconductor dice, said substrate array, said wire bonds, said die adapters, said collapsible spacer array and said heat spreader array into the molding compound to provide an array of molded packages. A plurality of ball grid arrays are formed on a second surface of said substrate array, bumps of said ball grid arrays being electrically connected to said conductive traces and each integrated circuit package is singulated from said array of molded packages.

In another aspect, there is provided an integrated circuit package. The integrated circuit package is a ball grid array package that includes a substrate that has a plurality of conductive traces. A semiconductor die is mounted to a first surface of the substrate and a die adapter is mounted to the semiconductor die. A plurality of wire bonds connect the semiconductor die and ones of the conductive traces. A heat spreader is disposed proximal to and spaced from the die adapter by at least one collapsible spacer. A molding compound encapsulates the semiconductor die, the wire bonds, the die adapter and the collapsible spacer between the substrate and the heat spreader. A ball grid array is disposed on a second surface of the substrate, bumps of the ball grid array being electrically connected to the conductive traces.

Advantageously, a heat spreader is incorporated into the BGA package during molding. The heat spreader is prepared and placed in the mold and is incorporated into the package by molding. An array of heat spreaders is placed in the mold and molded with a substrate array such that a plurality of packages including heat spreaders are manufactured in a single mold shot.

A thermal path is provided from the semiconductor die, through the die adapter and the collapsible spacer and to the heat spreader. Also, the heat spreader is effectively pressed against the lower mold die surface during molding, thereby inhibiting mold flash on the outer side of the heat spreader. The incorporation of a deformable material (collapsible spacer) that is stable at molding temperature, provides a compliant layer between the substrate and the heat spreader and between the semiconductor die and the heat spreader. Thus, the heat spreader is pressed against the lower mold die, maintaining the heat spreader in contact with the lower mold die during molding and reducing mold flash.

In another aspect, ground bonds are provided between the semiconductor die and the die adapter. Thus, a ground path is provided through the die adapter, the collapsible spacer in contact with the die adapter, the heat spreader and the collapsible spacers in contact with the substrate. Advantageously, better signal layout on the substrate can be achieved and better wire looping control is provided. Also, ground wire length is reduced.

BRIEF DESCRIPTION OF THE DRAWINGS

The invention will be better understood with reference to the following description and to the drawings, in which.

DETAILED DESCRIPTION OF THE PREFERRED EMBODIMENTS

Figure 1:
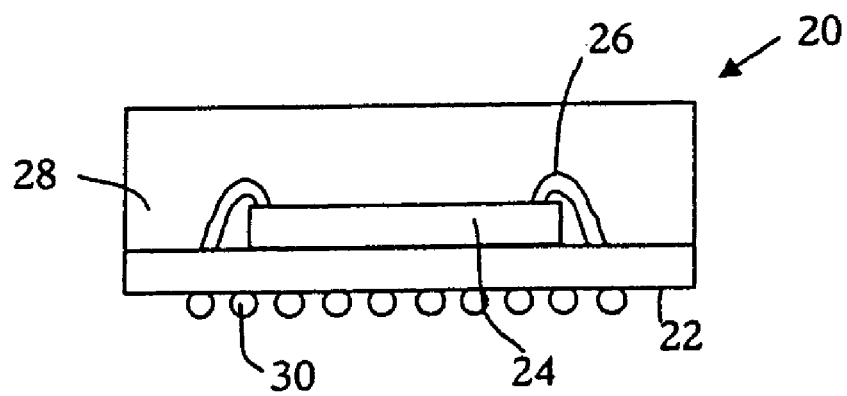
FIG. 1 shows an elevation view of a conventional plastic ball grid array package.
Figure 2:
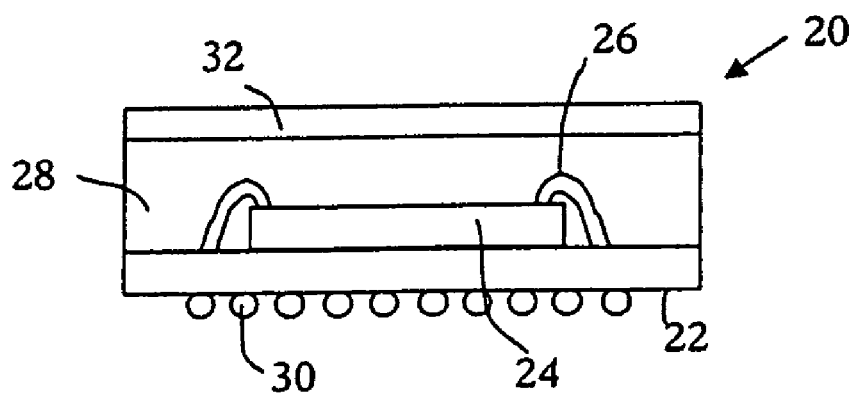
FIG. 2 shows an elevation view of a prior art plastic ball grid array package including a heat spreader.

Reference is now made to FIGS. 3A to 3K to describe a process for manufacturing a ball grid array package, according to an embodiment of the present invention. To simplify the description, the numerals used previously in describing FIG. 1 will be used again after raising the numerals by 100 where parts to be described correspond to parts already described.

Figure 3A:
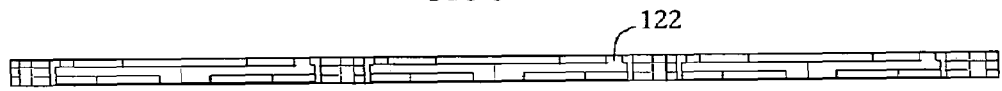
FIGS. 3A to 3K show processing steps for manufacturing a ball grid array package, in accordance with one embodiment of the present invention.
Figure 3B:
Figure 3C:
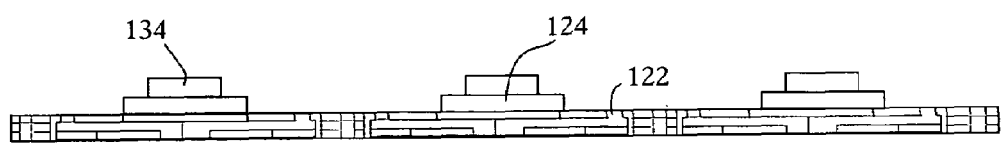
Figure 3D:
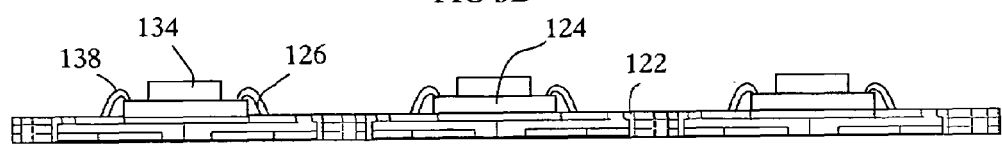
Figure 3E:
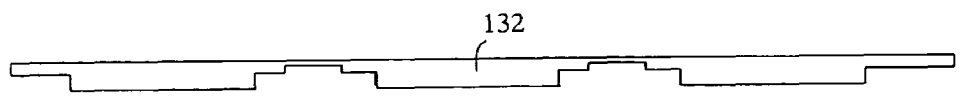
Figure 3F:
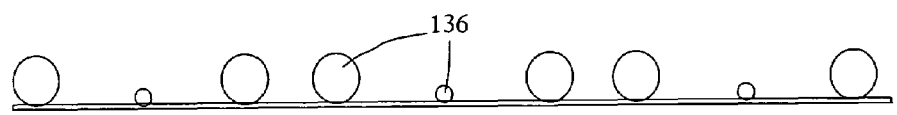
Figure 3G:
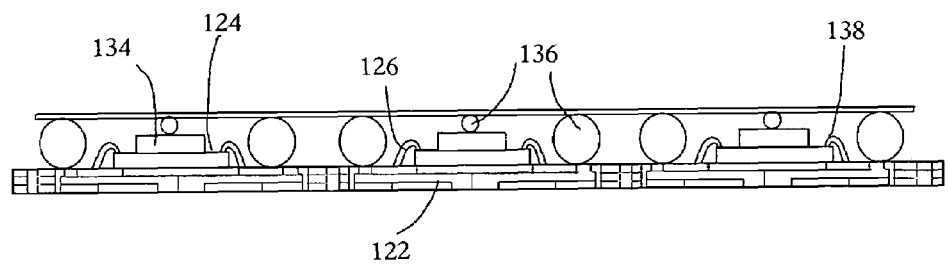
Figure 3H:
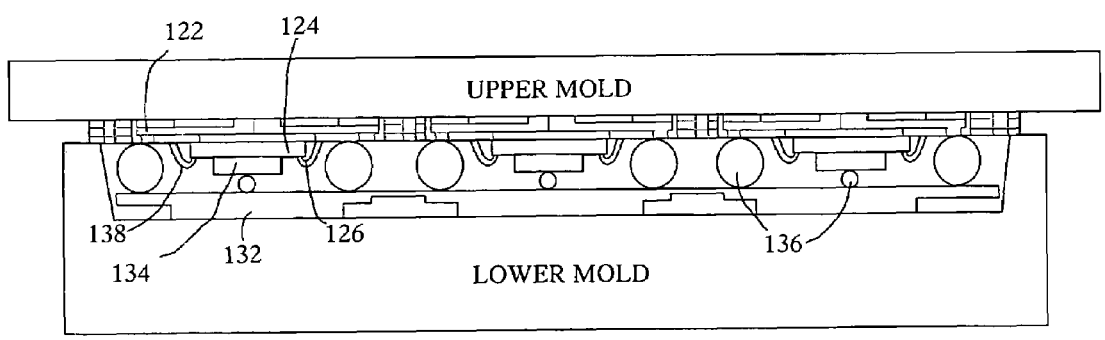
Figure 3I:
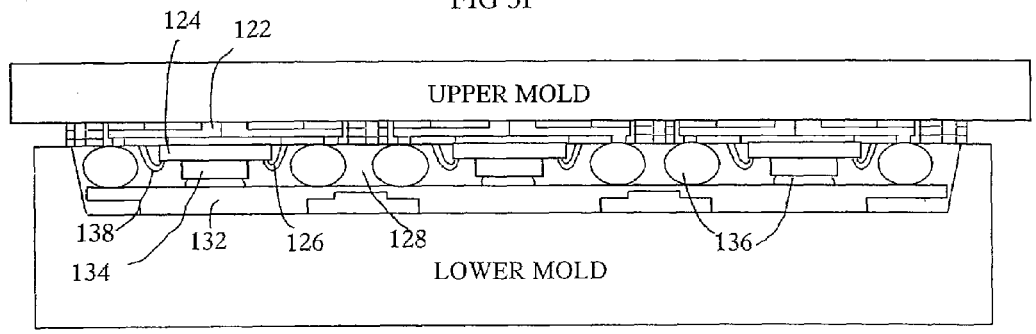
Figure 3J:
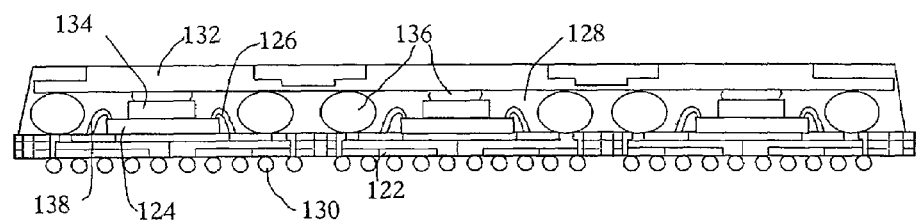
Figure 3K:
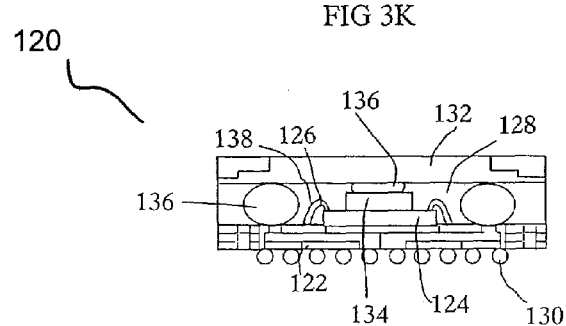

Referring to FIG. 3K, the ball grid array package is indicated generally by the numeral 120. The package 120 includes a substrate 122 that has a plurality of conductive traces. A semiconductor die 124 is mounted to a first surface of the substrate 122 and a die adapter 134 is mounted to the semiconductor die 124. A plurality of wire bonds 126 connect the semiconductor die 124 and ones of the conductive traces. A heat spreader 132 is disposed proximal to and spaced from the die adapter 134 by at least one collapsible spacer 136. A molding compound 128 encapsulates the semiconductor die 124, the wire bonds 126, the die adapter 134 and the collapsible spacer 136 between the substrate 122 and the heat spreader 132. A ball grid array 130 is disposed on a second surface of the substrate 122, bumps of the ball grid array 130 being electrically connected to the conductive traces.

The process for manufacturing the ball grid array package 120, according to one embodiment of the present invention, will now be described in more detail. Referring to FIG. 3A, the substrate 122 of a BT resin/glass epoxy printed circuit board with conductive traces for signal transfer is shown. A solder mask is disposed on the lower surface of the substrate, with portions of the conductive traces (interconnects) exposed. The substrate 122 is in the form of an array strip for producing a number of BGA units. Three such units are depicted in an array in FIG. 3A.

A singulated semiconductor die 124 is conventionally mounted to an upper surface of the substrate 122 using a suitable die attach adhesive (FIG. 3B). In the present embodiment, the semiconductor die 124 is attached using an epoxy and the epoxy is cured.

A die adapter 134 is mounted to the semiconductor die 124 using a thermally conductive adhesive for conducting heat from the semiconductor die 124 to the adapter 134 (FIG. 3C). In the present embodiment, the die adapter 134 is copper.

The semiconductor die 124 has a conductive pad array formed thereon and wire bonds 126 are bonded between the conductive pads of the array and the conductive traces on the substrate 122 using conventional wire bonding techniques (FIG. 3D). Ground wire bonds 138 are also bonded between pads of the array and a ground pad on the substrate 122.

The heat spreader 132 is manufactured in the form of an array frame that is compatible with the substrate array 122 (FIG. 3E). In the present embodiment the heat spreader is a copper strip that is etched to form the array frame. The array frame includes a number of heat spreaders 132 joined together by partially-etched tie-bars. Three such heat spreaders are depicted in FIG. 3E.

A plurality of collapsible spacers 136 are mounted to the substrate 122. In the present embodiment, the collapsible spacers 136 are manufactured in the form of an array that is compatible with the substrate array 122 and the heat spreader 132 (FIG. 3F). The collapsible spacers 136 are comprised of a solder preform of a plurality of substantially spherical balls connected together by tie bars. The collapsible spacers 136 are mounted to the substrate 122 using epoxy. It will be appreciated that some of the collapsible spacers 136 are mounted directly on the substrate 122 and other collapsible spacers 136 are mounted to corresponding die adapters 134 (FIG. 3G).

Figure 4:
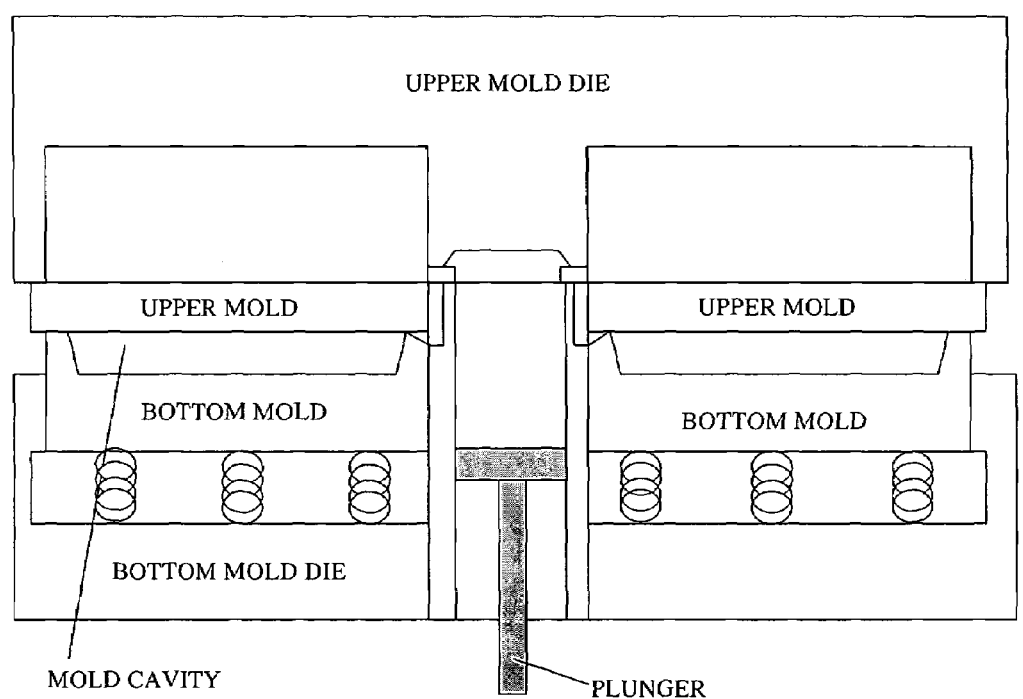
FIG. 4 shows a mold including molding dies and a mold cavity for molding the ball grid array package according to an embodiment of the present invention.

The heat spreader 132, in the array format, is placed in the bottom of the die cavity, on the lower surface of the mold. Features of the mold cavity and the frame are designed such that the heat spreader 132 aligns with the substrate 122 in the die cavity. The substrate array strip 122 is clamped to a surface of an upper mold die, in the mold cavity such that the semiconductor die 124, the die adapter 134 and the collapsible spacers 136 protrude from the substrate 22 into the mold cavity. The collapsible spacers 136, in the array format, are thus disposed between the heat spreader 132 and the substrate 122 (FIG. 3H). A suitable mold including the molding dies and mold cavity is shown in FIG. 4.

Molding using a molding compound 128 in the mold cavity follows. During molding, the collapsible spacers 136 are compressed between the substrate 122 and the heat spreader 132 and between the die adapter 134 and the heat spreader 132, causing deformation of the collapsible spacers 136 (FIG. 3I). The molding compound 128 encapsulates the wire bonds 126, the semiconductor die 124, the die adapter 134, and the collapsible spacer 136 between the heat spreader 132 and the substrate 122, and joins the heat spreader 132 to the remainder of the package 120. The heat spreader 132 is thereby pressed against the lower surface of the mold in the die cavity.

After removing the package 120 from the mold, the solder balls 130, also referred to as solder bumps, are formed on the lower surface of the substrate 122 by conventional positioning (FIG. 3J). To attach the solder balls 130, a flux is added to the balls prior to placement and, after placement the solder balls 130 are reflowed using known reflow techniques. The solder balls are thereby connected to the conductive traces of the substrate 122 and through the wire bonds 126 to the semiconductor die 124. The solder balls 130 provide signal and power connections as well as ground connections for the semiconductor die 124.

Singulation of the individual BGA unit from the array strip is then performed either by saw singulation or die punching, resulting in the configuration shown in FIG. 3K. Thus, the individual BGA package is isolated from the strip.

Figure 5:
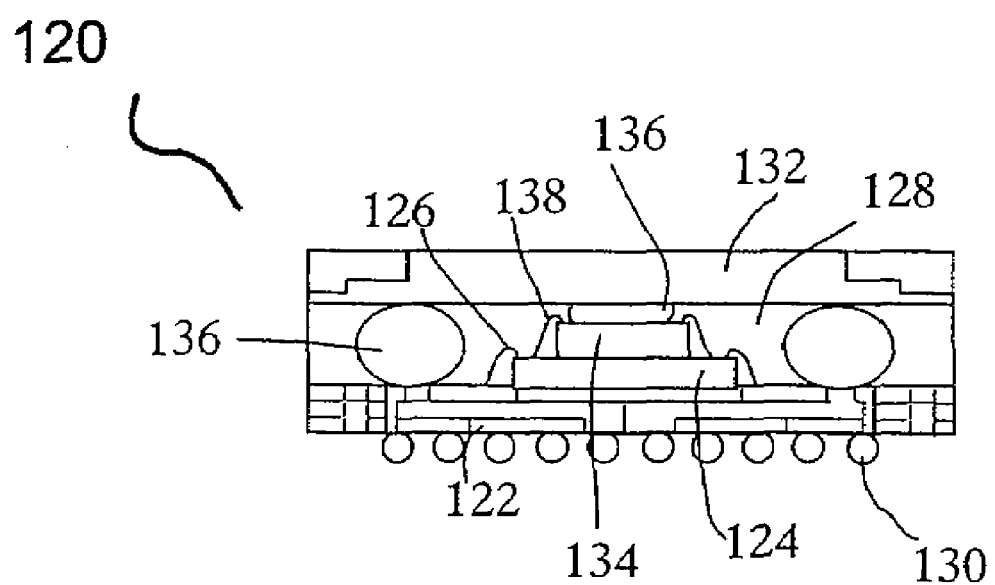
FIG. 5 shows a ball grid array package manufactured in accordance with an alternative embodiment of the present invention.

Reference is now made to FIG. 5 to describe an alternative embodiment of the ball grid array package 120 according to the present invention. The process steps for manufacturing the ball grid array package 120 of FIG. 5 are similar to the process steps for manufacturing the ball grid array package of FIG. 3J, and therefore these process steps need not be further described herein.

During wire bonding of the package shown in FIG. 5, wire bonds 126 are bonded between the conductive pads of the array and the conductive traces of the substrate 122 using conventional wire bonding techniques, as described with reference to FIG. 3D. Ground wire bonds 138, however, are bonded between pads of the array and a surface of the die adapter 134. A ground path is provided as the collapsible spacers 136 that contact the heat spreader 132 and the substrate 122, contact ground pads on the substrate 122. Thus, the ground path is provided through the die adapter 134, the collapsible spacer 136 in contact with the die adapter 134, the heat spreader 132 and the collapsible spacers 136 in contact with the ground pads of the substrate 122.

Figure 6A:
FIGS. 6A to 6J show processing steps for manufacturing a ball grid array package, in accordance with another embodiment of the present invention.
Figure 6B:
Figure 6C:
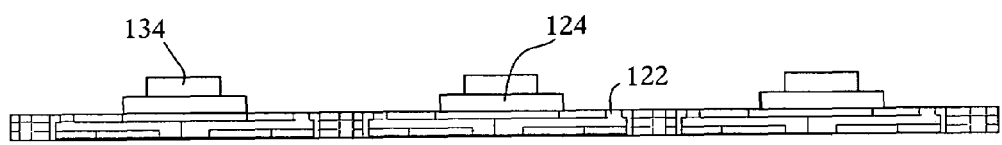
Figure 6D:
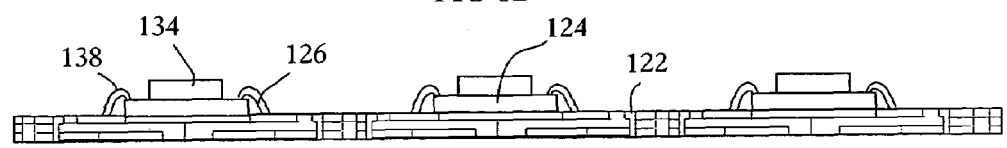
Figure 6E:
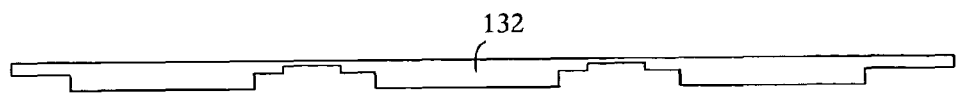
Figure 6F:
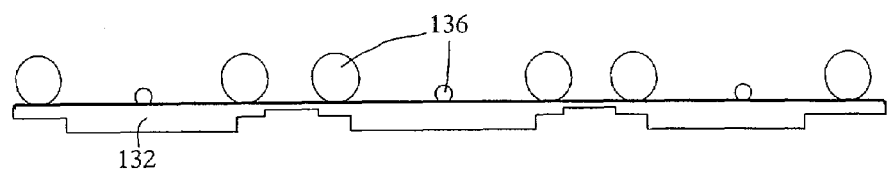
Figure 6G:
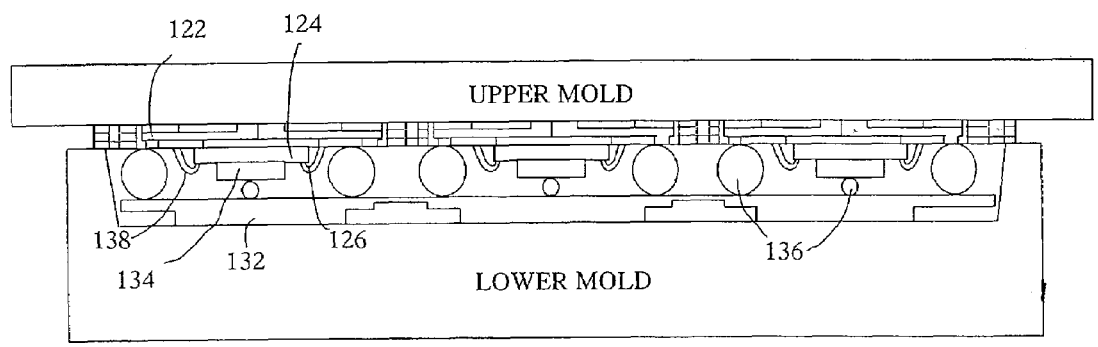
Figure 6H:
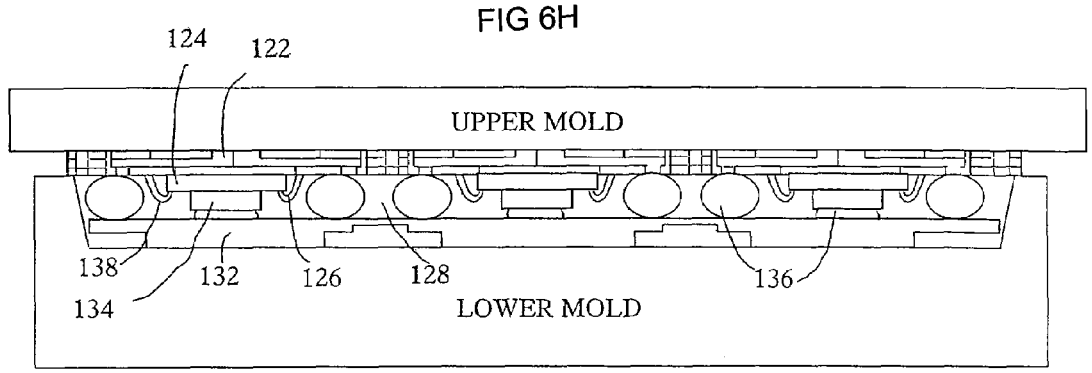
Figure 6I:
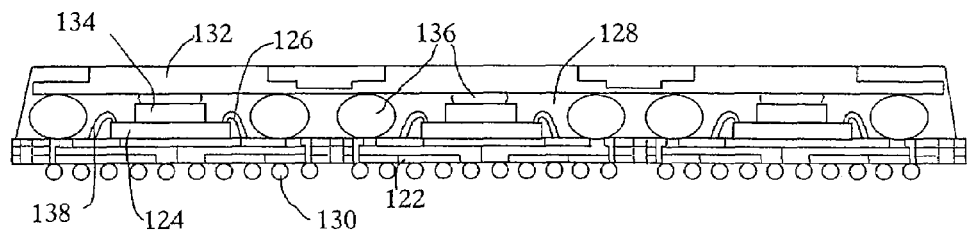
Figure 6J:
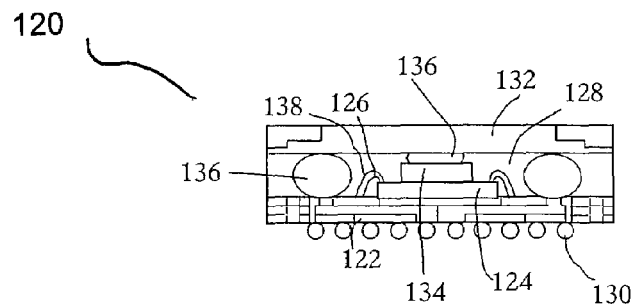

Reference is now made to FIGS. 6A to 6J to describe a process for manufacturing the ball grid array package 120, in accordance with another embodiment of the present invention. FIGS. 6A to 6E are similar to FIGS. 3A to 3E and therefore need not be further described herein. In FIG. 6F, however, the collapsible spacers 136 are mounted to the heat spreader 132, rather than the substrate. The heat spreader 132, in the array format, is then placed in the bottom of the die cavity, on the lower surface of the mold such that the collapsible spacers 136 protrude into the mold cavity. Features of the mold cavity and the frame are designed such that the heat spreader 132 aligns with the substrate 122 in the die cavity. The substrate array strip 122 is clamped to a surface of an upper mold die, in the mold cavity such that the semiconductor die 124 and the die adapter 134 protrude from the substrate 22 into the mold cavity. The collapsible spacers 136, in the array format, are thus disposed between the heat spreader 132 and the substrate 122 and between the heat spreader and the die adapter (FIG. 6G). FIGS. 6H to 6J are similar to FIGS. 3I to 3K and therefore need not be further described herein.

Figure 7A:
FIGS. 7A to 7J show processing steps for manufacturing a ball grid array package, in accordance with yet another embodiment of the present invention.
Figure 7B:
Figure 7C:
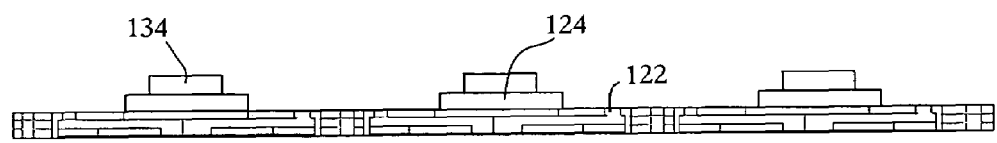
Figure 7D:
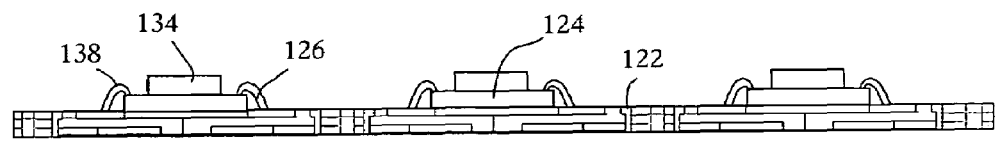
Figure 7E:
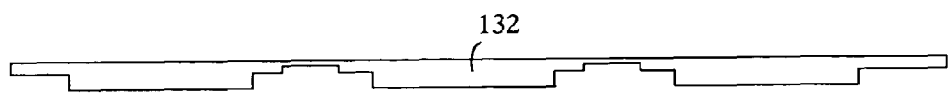
Figure 7F:
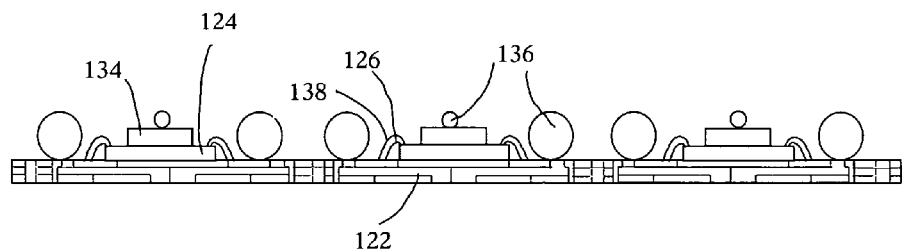
Figure 7G:
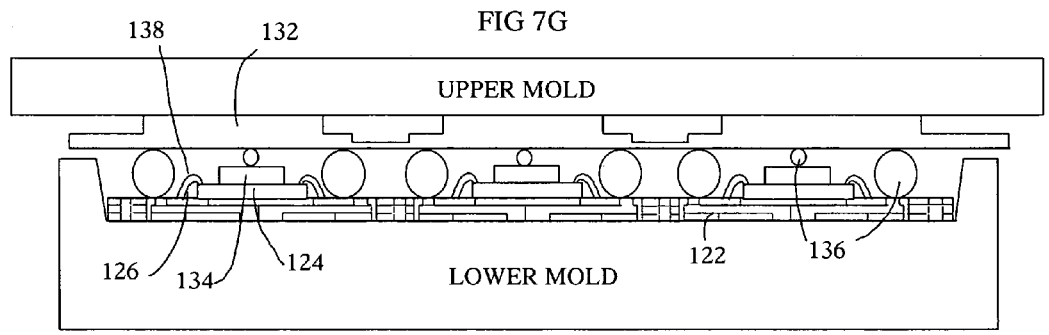
Figure 7H:
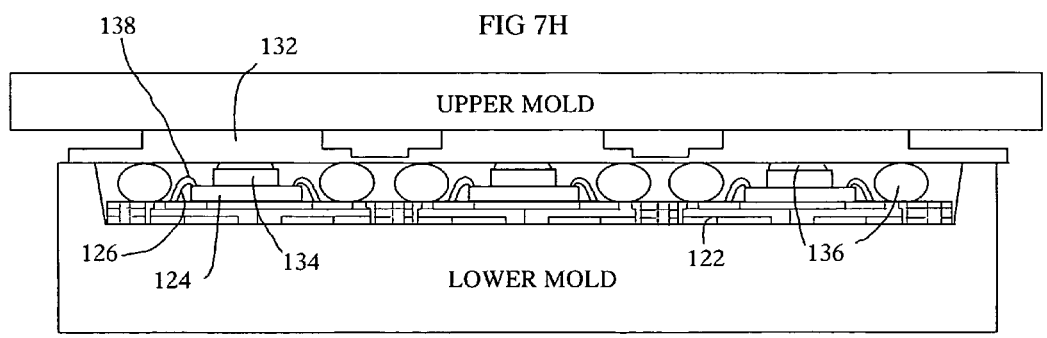
Figure 7I:
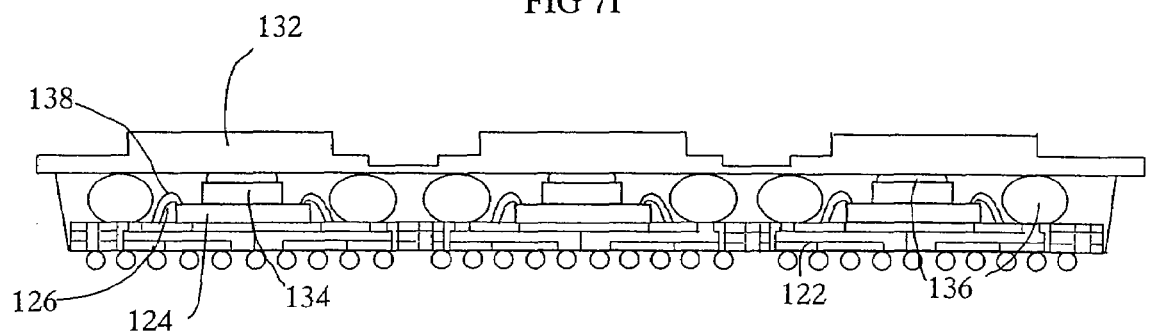
Figure 7J:
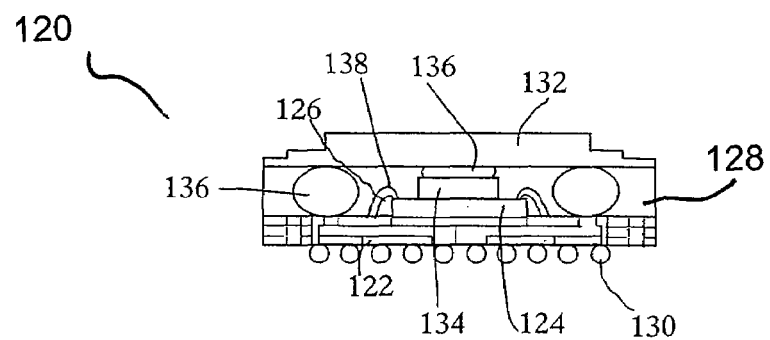

Alternative embodiments and variations are possible. For example, rather than placing the heat spreader 132 in the bottom of the mold cavity and clamping the substrate 122 to the top mold die, the substrate 122 can be placed in the bottom of the mold cavity and the heat spreader 132 clamped to the top of the mold die. FIGS. 7A to 7J show the processing steps for manufacturing a ball grid array according to one embodiment of the present invention. FIGS. 7G and 7H show the substrate 122 disposed in the bottom of the mold cavity and the heat spreader 132 clamped to the top mold die (FIG. 7H).

In another alternative, the collapsible spacers 136 are individually placed on the substrate 122 and die adapter 134 or on the heat spreader 132, rather than being manufactured in the form of an array (FIGS. 7A to 7J). In the embodiment shown in FIGS. 7A to 7J, the collapsible spacers 136 are placed in the appropriate position on the substrate 122 and die adapters 134 with pre-dispensed flux using pick and place technology, followed by solder reflow. In still another alternative embodiment, epoxy is pre-applied to the substrate 122 and the die adapter 134 or on the heat spreader 132, the collapsible spacers 136 are placed using pick and place technology and the epoxy is cured.

Other alternative embodiments and variations are also possible. For example, rather than etching a copper strip to prepare the array frame of heat spreaders 132, the frame can be manufactured by metal stamping. Also, the heat spreader is not limited to copper as other suitable heat spreader materials are possible and will occur to those skilled in the art. In the above-described embodiments, the collapsible spacers are mounted to the substrate or the heat spreader using epoxy, however other means for mounting the collapsible spacers are possible. For example, the collapsible spacers can be mounted using solder reflow technique. Also, the collapsible spacers are not limited to solder preform as other suitable materials can be employed, including for example, low modulus conductive polymer such as silicone or a thermoplastic material with low modulus such as polycarbonate. The die adapter 134 is not limited to copper as other suitable materials can be used. For example, the die adapter can be constructed of silicon, ceramics and other metals. In the embodiment shown in FIG. 5, the die adapter is constructed of a material suitable for wire bonding, such as silver plated, or copper or aluminum coated silicon. Still other embodiments and variations may occur to those of skill in the art. All such embodiments and variations are believed to be within the scope and sphere of the present invention.

What is claimed is:

1. An integrated circuit package comprising:
   a substrate having a plurality of conductive traces;
   a semiconductor die mounted on a first surface of said substrate;
   a die adapter mounted on said semiconductor die;
   a plurality of wire bonds between said semiconductor die and ones of said conductive traces;
   a heat spreader disposed proximal to and spaced from said die adapter by at least one collapsible spacer, wherein the collapsible spacer is a substantially spherical ball;
   a molding compound encapsulating the semiconductor die, the wire bonds, the die adapter and said collapsible spacer between the substrate and the heat spreader; and
   a ball grid array on a second surface of said substrate, bumps of said ball grid array being electrically connected to said conductive traces.

2. The integrated circuit package according to claim 1, wherein said at least one collapsible spacer comprises a collapsible spacer disposed between and in contact with said heat spreader and said die adapter.

3. The integrated circuit package according to claim 1, wherein wire bonding further comprises ground wire bonding said semiconductor die to at least one ground pad on said substrate.

4. An integrated circuit package comprising:
a substrate having a plurality of conductive traces;
a semiconductor die mounted on a first surface of said substrate;
a die adapter mounted on said semiconductor die;
a plurality of wire bonds between said semiconductor die and ones of said conductive traces;
a heat spreader disposed proximal to and spaced from said die adapter by at least one collapsible spacer;
a molding compound encapsulating the semiconductor die, the wire bonds, the die adapter and said collapsible spacer between the substrate and the heat spreader; and
a ball grid array on a second surface of said substrate, bumps of said ball grid array being electrically connected to said conductive traces,
wherein said at least one collapsible spacer further comprises a plurality of collapsible spacers disposed between and in contact with said heat spreader and said substrate array.

5. An integrated circuit package comprising:
a substrate having a plurality of conductive traces;
a semiconductor die mounted on a first surface of said substrate;
a die adapter mounted on said semiconductor die;
a plurality of wire bonds between said semiconductor die and ones of said conductive traces;
a heat spreader disposed proximal to and spaced from said die adapter by at least one collapsible spacer;
a molding compound encapsulating the semiconductor die, the wire bonds, the die adapter and said collapsible spacer between the substrate and the heat spreader; and
a ball grid array on a second surface of said substrate, bumps of said ball grid array being electrically connected to said conductive traces,
wherein wire bonding further comprises ground wire bonding said semiconductor die to said die adapter.

* * * * *